United States Patent
Ito et al.

(10) Patent No.: US 6,320,398 B1
(45) Date of Patent: Nov. 20, 2001

(54) SEMICONDUCTOR DEVICE TESTING APPARATUS

(75) Inventors: Akihiko Ito, Hanyu; Yoshihito Kobayashi, Gyoda, both of (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/051,419
(22) PCT Filed: Aug. 8, 1997
(86) PCT No.: PCT/JP97/02788
  § 371 Date: Apr. 6, 1998
  § 102(e) Date: Apr. 6, 1998
(87) PCT Pub. No.: WO98/07041
  PCT Pub. Date: Feb. 19, 1998

(30) Foreign Application Priority Data

Aug. 9, 1996  (JP) .................................................. 8-211584

(51) Int. Cl.$^7$ .................................................. G01R 31/02
(52) U.S. Cl. ........................................ 324/755; 324/158.1
(58) Field of Search ............................... 324/755, 158.1, 324/754, 760, 758, 763; 439/70, 71, 66, 68

(56) References Cited

U.S. PATENT DOCUMENTS

| | | | |
|---|---|---|---|
| 4,252,391 | * | 2/1981 | Sado .................................. 339/60 R |
| 4,766,371 | * | 8/1988 | Moriya ................................. 324/763 |
| 4,778,950 | * | 10/1988 | Lee et al. .......................... 74/356 C |
| 4,933,747 | * | 6/1990 | Schroeder ............................. 357/82 |
| 5,227,717 | * | 7/1993 | Tsurishima ........................... 324/754 |
| 5,313,156 | * | 5/1994 | Klug et al. .......................... 324/754 |
| 5,419,710 | * | 5/1995 | Pfaff ..................................... 439/266 |
| 5,440,240 | * | 8/1995 | Wood et al. .......................... 324/765 |
| 5,461,327 | * | 10/1995 | Shibata et al. ....................... 324/760 |
| 5,800,184 | * | 9/1998 | Lopergolo et al. ................... 439/66 |
| 5,966,022 | * | 10/1999 | Budnaitis et al. ................... 324/760 |
| 6,244,874 | * | 6/2001 | Tan ......................................... 439/66 |

FOREIGN PATENT DOCUMENTS

| | | |
|---|---|---|
| 63236978 | 10/1988 | (JP) . |
| 04349057 | 12/1992 | (JP) . |
| 4-131773 | 12/1992 | (JP) . |
| 5-288803 | 11/1993 | (JP) . |
| 6-27192 | 2/1994 | (JP) . |
| 8-194032 | 7/1996 | (JP) . |
| 8-335486 | 12/1996 | (JP) . |
| 9-33606 | 2/1997 | (JP) . |
| 9-102537 | 4/1997 | (JP) . |

* cited by examiner

Primary Examiner—Safet Metjahic
Assistant Examiner—T. R. Sundaram
(74) Attorney, Agent, or Firm—David N. Lathrop; Gallagher & Lathrop

(57) ABSTRACT

A semiconductor device testing apparatus is provided which allows for eliminating the need to replace IC sockets even if the type of IC package is changed. A device receiving carrier 100 accommodating the IC to be tested has its bottom open. A fine conductive wire-embedded member 110 is mounted to the open bottom of the device receiving carrier. The wire-embedded member comprises a resilient rubber plate 111 and a number of fine conductive wires 112 embedded in the rubber plate, the fine conductive wires being electrically insulated from each other and extending through the thickness of the rubber plate with the opposite ends exposed at the opposed surfaces of the rubber plate. The IC to be tested is rested on the wire-embedded member. A board 70 is mounted to the test head, the board having gold pads 72 formed in a manner electrically insulated from each other in the surface thereof at at least the positions opposing the terminals of the IC to be tested placed on the top surface of the wire-embedded member. During the testing of the IC in the test section, the bottom surface of the wire-embedded member is put into contact with the board to establish electrical connection between the terminals of the IC and the corresponding gold pads of the board through the fine conductive wires of the wire-embedded member.

32 Claims, 10 Drawing Sheets

SEMICONDUCTOR DEVICE TESTING APPARATUS

TECHNICAL FIELD

The present invention relates to a semiconductor device testing apparatus for testing semiconductor devices as to whether they operate in normal condition or not, and more particularly to a semiconductor device testing apparatus of the type in which a semiconductor device to be tested, particularly a semiconductor integrated circuit that is a typical example of semiconductor devices, is transported on a test tray to a test or testing section where it is tested for its electrical characteristic while remaining placed on the test tray, and upon completion of the test, the tested semiconductor integrated circuit together with the test tray is carried out of the test section, followed by being sorted out on the basis of the data of the test results.

BACKGROUND ART

Many semiconductor device testing apparatus (commonly called IC tester), which measures the electrical characteristics of semiconductor integrated circuits (which will be referred to as ICs hereinafter) by applying a test signal of a predetermined pattern to the ICs being tested, have a semiconductor device transporting and processing or handling apparat us (commonly called handler) integrally connected thereto for transporting the ICs to be tested (ICs under test) to a test section where they are brought into electrical contact with a socket of the test head (a measuring section of the semiconductor device testing apparatus for applying and receiving various testing electrical signals), followed by carrying the tested ICs out of the test section and sorting them out into conforming and non-conforming articles on the basis of the data of the test results. The testing apparatus having the handler of the type described above integrally connected thereto is also herein termed "semiconductor device testing apparatus". In the following disclosure the present invention will be described by taking ICs typical of semiconductor devices by way of example for the convenience of explanation.

First, an example of the prior art handler called "horizontal transporting system" will be described with reference to FIG. 7. The handler 10 illustrated therein comprises a loader section 11 where ICs 15 to be tested which have been beforehand loaded on a customer tray (user tray) 13 by a user are transferred and reloaded onto a test tray 14 capable of withstanding high/low temperatures, a constant temperature chamber 20 including a test section 21 for receiving and testing the ICs transported from the loader section 11, and an unloader section 12 where the tested ICs 15 which have been carried on the test tray 14 out of the constant temperature chamber subsequently to undergoing a test in the test section 21 are transferred from the test tray 14 to the customer tray 13 to be reloaded on the latter (generally, the tested ICs are often sorted by categories based on the data of the test results and transferred onto the corresponding customer trays).

The test tray 14 is moved in a circulating manner from and back to the loader section 11 sequentially through the constant temperature chamber 20 and the unloader section 12. More specifically, the test tray 14 loaded with ICs 15 to be tested is transported from the loader section 11 to a soak chamber 22 within the constant temperature chamber 20 where the ICs 15 placed on the tray 14 are heated or cooled to a predetermined constant temperature. Generally, the soak chamber 22 is configured to store a plurality of (say, ten) test trays 14 stacked one on another such that a test tray 14 newly received from the loader section 11 is stored at the top of the stack while the lowermost test tray of the stack is delivered to the test section 21 in the constant temperature chamber 20, for example. The ICs 15 to be tested are heated or cooled to a predetermined constant temperature while the test tray 14 is moved sequentially from the top to the bottom of the stack within the soak chamber 22, so that the ICs 15 are loaded with temperature stresses of either a designed high or low temperature.

The ICs 15 heated or cooled to the constant temperature together with the test tray 14 are then transported while maintained at that temperature from the soak chamber 22 to the test section 21 where the ICs under test while remaining loaded on the test tray 14 are brought into electrical contact with an IC socket or sockets (not shown) disposed in the test section 21 to be measured for their electrical characteristics. Upon completion of the test, the tested ICs 15 together with the test tray 14 are transported from the test section 21 to an exit chamber 23 where the ICs 15 are restored to the ambient temperature.

Like the soak chamber 22, the exit chamber 23 is also configured to accommodate test trays in the form of a stack. For example, the arrangement is such that the tested ICs 15 are brought back to the ambient temperature as the associated test tray is moved sequentially from the bottom to the top of the stack within the exit chamber 23. Thereafter, the tested ICs 15 as carried on the test tray 14 are passed to the unloader section 12 where the tested ICs are sorted by categories based on the test results and transferred onto the corresponding customer trays 13. The test tray 14 emptied in the unloader section 12 is delivered back to the loader section 11 where it is again loaded with ICs 15 to be tested from the customer tray 13 to repeat the same steps of operation.

It is to be noted here that the transfer of ICs already tested as well as of ICs to be tested between the customer tray 13 and the test tray 14 is typically effected by suction transport means utilizing a vacuum pump which may pick up one to several ICs at a time for the transfer. In the loader section 11 the customer tray 13 is moved by the associated transfer arm 30 to a transfer position where ICs 15 to be tested are transferred from the customer tray 13 to the test tray 14, while in the unloader section 12 the customer tray 13 is moved by the associated transfer arm 30 to a receiving position to receive the tested ICs 15 from the test tray 14.

As discussed above, ICs 15 to be tested are carried on a test tray 14 from the loader section 11 to the test section 21 from where they are transported while carried on the test tray to the unloader section 12 after having undergone the test. In the test section 21, ICs under test are brought, while remaining placed on the test tray, into electrical contact with IC sockets which are supplied with a signal of a predetermined test pattern from the semiconductor device testing apparatus (hereinafter, referred to as IC tester), whereby the ICs are tested for their electrical characteristics. The test section 21 of the handler is disposed in the constant temperature chamber 20 since it needs to conduct the test on ICs 15 under test under an atmosphere of a designated temperature. The IC socket or sockets mounted to the test head need also be disposed in an adiabatic condition within the constant temperature chamber 20.

FIG. 8 illustrates an example of the construction of the test tray 14. The test tray 14 comprises a rectangular frame 16 having a plurality of (three in the illustrated example) equally spaced apart parallel cleats 17 extending longitudinally of the frame between the opposed longitudinal side frame members 16a and 16b of the frame. Each of the cleats 17 has a plurality of equally spaced apart mounting lugs 18 protruding therefrom on both sides thereof, and likewise each of the longitudinal side frame members 16a, 16b opposing the adjacent cleats has similar mounting lugs 18 protruding therefrom. The mounting lugs 18 protruding from each cleat 17 on both sides thereof are located such that each of the mounting lugs 18 protruding from the cleat 17 on one side thereof is positioned in the middle between two corresponding mounting lugs 18 protruding from that cleat 17 on the opposite side thereof. Likewise, each of the mounting lugs 18 protruding from the longitudinal side frame members 16a, 16b are located in the middle between two corresponding mounting lugs 18 protruding from the corresponding opposed cleats 17. A number of device receiving carriers 24 (which are known as tray inserts in the art) are accommodated in a juxtaposed relation in each of storage spaces defined between a pair of opposed cleats 17 and between one of the cleats and either one of the opposed longitudinal side frame members 16a, 16b.

Each device receiving carrier 24 is accommodated in one carrier compartment 19 in each of the storage spaces which compartment is defined by a rectangular lot containing two mounting lugs 18 at two diagonally opposite corners thereof. In the illustrated example, since each of the cleats 17 has sixteen mounting lugs 18 on each side thereof, sixteen carrier compartments 19 are defined in each of the storage spaces so that sixteen device receiving carriers 24 may be mounted in each storage space. In the illustrated example in which there are four such storage spaces, sixty-four (16×4) device receiving carriers 24 in total may be mounted in one test tray 14. Each device receiving carrier 24 is secured to two mounting lugs 18 by means of fasteners 28, for example.

Each of device receiving carriers 24 is of identical shape and size in its exterior contour and has an IC pocket 25 formed in the center for accommodating an IC to be tested therein. In this example, the IC pocket 25 is in the shape of a generally square recess. The shape and size of the IC pocket 25 are determined depending on those of the particular IC to be tested. It is for this reason that device receiving carriers 24 having various shapes and sizes are prepared and are in stock so that it is possible to exchange one type of device receiving carrier 24 for another having a corresponding shape and size to accommodate any particular shape and size of ICs whenever the type of ICs to be tested is changed.

The exterior of the device receiving carrier 24 is sized so as to loosely fit in the space defined between the opposed mounting lugs 18 of the carrier compartment 19. The device receiving carrier 24 has flanges extending from its opposed ends adapted to rest on the corresponding mounting lugs 18, these flanges having mounting holes 26 formed adjacent the lateral sides thereof for receiving the fasteners 28, and apertures 27 formed in the center for passing locating pins therethrough. FIG. 9 illustrates the device receiving carriers 24 mounted in the test tray 14 of the construction described above.

ICs 15 to be tested are each loaded on one of the device receiving carriers 24 in the test tray 14 as illustrated in FIG. 8 to be carried from the loader section 11 to the test section 21 in the constant temperature chamber 20 where they are brought, while remaining placed on the test tray, into electrical contact with the IC sockets mounted on the test head to be tested for their electrical characteristics.

Shown in FIG. 10 is an example of IC sockets mounted on the test head when the test tray 14 of the construction shown in FIG. 8 is employed. This example illustrates an array of IC sockets 60 arranged in a matrix of four rows (lateral rows)×eight columns (longitudinal rows). While the number of the rows of IC sockets 60 in this array is equal to that of the device receiving carriers 24 mounted in the test tray 14, the number of the columns of IC sockets is one half (½) of the number of the columns of the device receiving carriers 24. The reason is that the number of ICs that can be tested at one time in one IC tester is limited, so that it is difficult to test as many ICs as sixty-four at one time.

Accordingly, for the test tray 14 having the construction shown in FIG. 8, since device receiving carriers 24 are arranged in a matrix of four rows×sixteen columns, thirty-two (4×8) IC sockets 60 are mounted in the test head so as to be able to test all of the ICs in every other column in every row (lateral row) at one time in the test tray 14 as shown in FIG. 10 where the IC tester is configured to test thirty-two ICs at a time. More specifically, thirty-two (4×8) IC sockets 60 are arranged such that they will be placed into electrical contact with thirty-two (4×8) ICs in total located in the first, third, fifth, seventh, ninth, eleventh, thirteenth and fifteenth columns in every row, when the test tray 14 has been transported to the test head.

As illustrated in FIG. 11, the first run of test is conducted on the thirty-two ICs 15 (shown cross-hatched) located in the first, third, fifth, seventh, ninth, eleventh, thirteenth and fifteenth columns in every row in individual device receiving carriers 24, and the second run of test is effected on the other thirty-two ICs 15 located in the second, fourth, sixth, eighth, tenth, twelfth, fourteenth and sixteenth columns in every row by shifting the test tray 14 by a distance corresponding to one transverse width of the device receiving carrier 24.

In the case where the IC tester is equipped with sixteen (4×4) IC sockets 60 so as to be able to test sixteen ICs in every fourth column in every row in the test tray 14 all at once, the first run of test is conducted on the sixteen ICs in total located in the first, fifth, ninth and thirteenth columns in every row, the second run of test is effected on another sixteen ICs placed in the second, sixth, tenth and fourteenth columns in every row by shifting the test tray 14 by a distance corresponding to one transverse width of the device receiving carrier 24, the third run of test is similarly carried out on yet another sixteen ICs in the third, seventh, eleventh and fifteenth columns in every row by further shifting the test tray 14 by a distance corresponding to one transverse width of the device receiving carrier 24, and finally the fourth run of test is done on the final sixteen ICs in the fourth, eighth, twelfth and sixteenth columns in every row by further shifting the test tray 14 by a distance corresponding to one transverse width of the device receiving carrier 24, whereby all of the sixty-four ICs arrayed in four rows× sixteen columns may be tested.

It should be noted that when testing ICs housed in multi-pin packages, such IC packages are transferred from a customer tray 13 and loaded onto a test tray 14 as shown in FIG. 8 in the loader section 11 and then transported to the test section 21 where they are tested while remaining placed on the test tray. Such ICs housed in multi-pin packages include an IC housed in the ball grid array package (as will be referred to as BGA package hereinafter) of the type in which a semiconductor device (IC) is mounted on the upper surface of an insulation substrate of ceramic, plastic or the like with minute solder balls serving as terminals or electrodes being arranged on the undersurface of the substrate in a two-dimensional grid array; an IC housed in QFP (Quad Flat Package) of the surface mount type comprising a thin square or rectangular package body having lead pins protruding horizontally and parallel to each other from its four sides; and an IC housed in TSOP (Thin Small Outline Package) of the surface mount type comprising a thin rectangular package body having lead pins protruding horizontally and parallel to each other from its two opposed sides. Further, TSOP refers to SOP (Small Outline Package) having a package mounting height lower than 1.27 mm. It is also to be understood that the lead pins of the QFP and TSOP are formed in the shape of a gull wing and soldered to the electrode of the printed circuit board.

In the test section 21, the lead pins of IC packages carried on a test tray 14 are brought into electrical contact with IC sockets 60 mounted on the test head, followed by applying the IC sockets 60 with test signals of a predetermined pattern from the IC tester through a performance board attached to the test head to conduct the test on the ICs in the IC packages. The response signals from the ICs in the IC packages are transmitted to the IC tester body (main frame) through IC sockets 60 and the performance board to measure the electrical characteristics of the ICs.

In the case of BGA package, a multiplicity of grid-arrayed ball terminals 41 on the undersurface of the BGA package 40 placed in a device receiving carrier 24 in a test tray 14 are electrically contacted with the corresponding socket terminals 61 of an IC socket 60 in the test section 21, as shown in FIG. 12. In order to insure electrical contact between the ball terminals 41 and the socket terminals 61, a pusher 80 for pushing and holding the BGA package 40 down is mounted above the test head. The pusher 80 is configured to push the associated BGA package 40 accommodated in each device receiving carrier 24 from above down to positively put the ball terminals 41 into electrical contact with the opposing socket terminals 61 of the IC socket 60.

The device receiving carrier 24 mounted in the test tray 14 holds the BGA package 40 in place with the ball terminals 41 of the package exposed downwardly through the underside of the carrier while the test tray 14 is moved from the loader section 11 through he test section 21 to the unloader section 12. Due to the ball terminals 41 being disposed in a grid-like array on the substantially entire area of the undersurface of the BGA package 40, the device receiving carrier 24 needs to be formed through its bottom with a generally rectangular socket terminal access opening 243 having a considerably wide area as shown in FIG. 13 in order to permit all of the ball terminals 41 to contact with the socket terminals 61 of the IC socket 60. Consequently, as will be appreciated from FIG. 13, the bottom wall area 241 of the device receiving carrier 24 is greatly reduced with only the marginal wall portions 241 (primarily on the opposite longitudinal sides) left for carrying and supporting the BGA package 40 thereon.

Since the undersurface of the BGA package 40 generally has small areas left around its periphery on which no ball terminal 41 is disposed, the BGA package 40 can narrowly be retained by resting the left-over small peripheral areas on the marginal bottom wall portions 241 of the device receiving carrier 24. In recent years, however, BGA packages having ball terminals 41 disposed across the entire area of the undersurface have been manufactured. If such BGA packages are rested on the device receiving carrier 24 of the construction described above, some of the ball terminals would not be exposed out through the socket terminal access opening 243, resulting in inability to effect the test of the IC while remaining loaded on the device receiving carrier 24.

The bottom wall area 241 of the device receiving carrier 24 has thus had little area left for carrying and supporting the BGA package thereon due to the increase in number of lead pins with an enhancement in the integration level of the IC housed in the BGA package.

It will thus be appreciated that the IC tester of the above described construction adapted to conduct the test on the IC as carried on the test tray 14 could not be employed for the BGA package unless some or other means were developed for supporting the BGA package on the device receiving carrier 24.

In the case of QFP package, a multiplicity of lead pins 46 extending parallel from the four sides of the QFP 45 placed in a device receiving carrier 50 in a test tray 14 are electrically contacted with the corresponding socket terminals 66 of an IC socket 65 in the test section 21, as shown in FIG. 14. In order to insure electrical contact between the lead pins 46 and the socket terminals 66, the test head is equipped thereabove with a pusher 82 for pushing the lead pins 46 extending parallel from the four sides of the QFP 45 rested on each device receiving carrier 50 from above down against the opposing socket terminals 66 of the IC socket 65.

The device receiving carrier 50 mounted in the test tray 14 holds the QFP package 45 in place with the lead pins 46 extending parallel from the four sides of the QFP 45 exposed downwardly through the underside of the carrier. Because of the increase in number of lead pins provided in the QFP 45, it is seen in FIG. 15 that the lead pins 46 are formed along the four sides of the package 45 (rectangular in this example) up to the opposite ends of the respective sides (up to the vicinities of the respective corners).

As is seen from FIG. 15, four socket terminal access slits 52 are formed in the bottom wall 51 of the device receiving carrier 50 along the four sides of the QFP 45 to permit all of the lead pins 46 to contact with the socket terminals 66 of the IC socket 65 such that the opposite ends of each slit extends very close to the ends of the adjacent slit, leaving only narrow joint solid portions between the ends of the adjacent slits. As a result, as is appreciated from FIG. 15, the central rectangular bottom wall area 51 of the device receiving carrier 50 for carrying and supporting the QFP 45 is connected by the aforesaid narrow joint portions with peripheral bottom wall portion of the device receiving carrier 50, leading to the disadvantages that not only the mechanical strength of the bottom wall area 51 of the device receiving carrier 50 for carrying the QFP 45 is substantially reduced, but also the mechanical strength of the device receiving carrier 50 per se is reduced.

It is to be noted here that testing high speed ICs requires to apply high frequency signals, which in turn requires to reduce the thickness of the IC socket as much as possible. Such reduced thickness of the IC socket further aggravates the difficulty in forming the device receiving carrier 24 with a bottom wall for resting an IC package such as BGA package thereon as well as the problem of the reduced mechanical strength of the bottom wall area of the device receiving carrier 50.

As was discussed before with reference to FIG. 7, ICs (actually, packages housing ICs) 15 being tested as transferred onto the test tray 14 in the loader section 11 are transported into the constant temperature chamber 20 where they are heated or cooled to a predetermined constant temperature and then passed to the test section 21 within the constant temperature chamber 20 where the ICs while maintained at that predetermined temperature and carried on the test tray 14 are subjected to the testing. Upon completion of the testing, the tested IC packages 15 loaded on the test tray 14 are transported together with the test tray 14 out of the constant temperature chamber 20.

On the other hand, whenever the type of the IC package to be tested is changed, the IC socket with which the terminals such as ball terminals 41 or lead pins 46 of the IC package are electrically contacted is changed correspondingly. It is not easy, however, to carry out such exchange operation, as will be explained below.

The IC sockets 60, 65 of the IC tester are mounted in the performance board of the test head which is in turn disposed in the bottom of the constant temperature chamber 20. The IC sockets 60, 65 are fixed in position such that the upper portions of the IC sockets including the socket terminals are exposed in the constant temperature chamber 20 so as to be able to conduct the test on the ICs while maintained at a predetermined temperature (see FIG. 6). Consequently, to change the IC sockets 60, 65 requires first to withdraw the IC sockets from the constant temperature chamber 20, followed by removing the IC sockets fixed in a board to replace them by another type of IC sockets.

However, withdrawal of the IC sockets 60, 65 from the constant temperature chamber 20 opens the bottom of the chamber maintained at a predetermined temperature to allow the ingress of the outside air thereinto, resulting in either lowering or raising the temperature in the chamber. It will thus be appreciated that when the type of the IC package to be tested has been changed, it is required to reset the temperature in the constant temperature chamber 20 at a predetermined temperature, in addition to first replacing the IC sockets and then presenting the test head back to the chamber so as to expose the upper portions of the new IC sockets including the socket terminals to the interior of the constant temperature chamber 20. Accordingly, a substantial amount of time and troublesome operations have been required before the testing of the new type of ICs may be resumed, undesirably resulting in the need for quite a long testing time.

DISCLOSURE OF THE INVENTION

It is an object of the present invention to provide a semiconductor device testing apparatus configured to eliminate the need for replacing IC sockets when the type of the IC package to be tested is changed.

It is another object of the present invention to provide a semiconductor device testing apparatus including a test tray having device receiving carriers mounted thereto, each device receiving carrier being capable of firmly holding a semiconductor device to be tested housed in a package having a multiplicity of terminals and enabling the testing of the semiconductor device carried thereon with high reliability.

The foregoing objects of the present invention are accomplished by providing a semiconductor device testing apparatus constructed such that in a loader section, semiconductor devices to be tested are each transferred onto device receiving carriers mounted to a test tray, the test tray being then transported from the loader section to a test section where the semiconductor devices are tested for their electrical characteristics while remaining placed on the test tray, and upon completion of the test, the tested semiconductor devices together with the test tray are transported out of the test section, in which each of the device receiving carriers accommodating the semiconductor device to be tested has its bottom open, a fine conductive wire-embedded member being mounted to the open bottom of the device receiving carrier, the fine conductive wire-embedded member comprising a resilient insulator plate or sheet and a number of fine conductive wires embedded in the insulator plate, the conductive wires being electrically insulated from one another and extending through the thickness of the insulator plate with the opposite ends exposed at the opposed surfaces of the insulator plate, and the semiconductor device to be tested being rested on the fine conductive wire-embedded member such that the member functions as a socket for the semiconductor device during the testing.

In a first preferred embodiment, the fine conductive wire-embedded member is securely fitted in a groove formed in the inner wall of the lower portion of the device receiving carrier.

Preferably, the spacings between the adjacent fine conductive wires of the fine conductive wire-embedded member are chosen to be 0.1 mm or approximately 0.1 mm.

Further, in the first embodiment, the test head has boards mounted thereto, the boards being adapted to be in contact with the bottom surface of the fine conductive wire-embedded member during the testing of the semiconductor devices in the test section. Each of the boards has conductor pads formed in a manner electrically insulated from each other in the surface thereof at at least the positions opposing the terminals of the corresponding semiconductor device being tested placed on the top surface of the fine conductive wire-embedded member to establish electrical connection between the terminals of the semiconductor device and the corresponding conductor pads of each board through the fine conductive wire of the fine conductive wire-embedded member.

The semiconductor device to be tested is housed in a package of the ball grid array structure having small solder balls arrayed in the form of a grid on the bottom thereof, the conductor pads being formed in the surface of the board at the positions opposing the respective solder balls.

Preferably, the conductor pads formed in the surface of the board are gold pads. Also, the board has multi-layered wiring patterns formed therein, the conductor pads formed in the surface of the board being electrically connected with the corresponding wiring patterns.

In a second preferred embodiment, the semiconductor device to be tested is housed in a package of the surface mount type having terminals protruding parallel to each other from its two opposed sides. The conductor pads are formed in two rows spaced apart by a predetermined distance in the surface of the board, each row including a multiplicity of conductor pads, the pitch of the conductor pads in each row corresponding with that of the terminals of the semiconductor device being tested, and each conductor pad being elongated in a direction perpendicular to the longitudinal direction of the row.

In the first and the second embodiments, the fine conductive wire-embedded member is secured to the bottom of the device receiving carrier by fastener means.

In addition, in the first and the second embodiments, the fine conductive wire-embedded member is securedly bonded to the bottom of the device receiving carrier by suitable adhesive.

The test head has a circuit board with which the wiring patterns of the boards mounted to the test head are adapted to be connected, the circuit board being replaceable in accordance with a change of the type of semiconductor device to be tested.

The device receiving carrier constructed as described above is capable of firmly holding even a semiconductor device being tested housed in a rectangular or square surface mount type package having terminals extending from its four sides and enabling the testing of the semiconductor device as carried thereon with high reliability.

BEST MODES FOR CARRYING OUT THE INVENTION

Preferred embodiments of the invention will be described in detail. While the invention is described with reference to an IC tester for testing ICs typical of semiconductor devices, it is evident that the present invention is equally applicable to various types of semiconductor device testing apparatus adapted for testing other types of semiconductor devices other than ICs.

Figure 1:
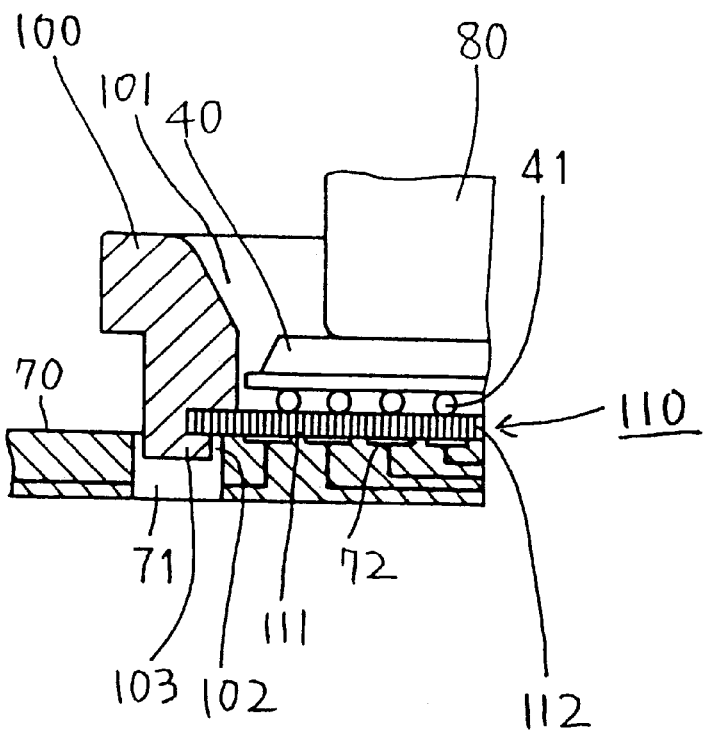
FIG. 1 is a schematic cross-sectional view showing the pertinent portions of a first embodiment of the semiconductor device testing apparatus according to the present invention.

FIG. 1 shows the pertinent portions of a first embodiment of the IC tester according to the present invention which is applicable when the IC packages placed and supported in IC pockets 101 of a device receiving carrier 100 are BGA packages. It is a schematic cross-sectional view illustrating the electrical connection between a BGA package 40 loaded on the device receiving carrier 100 and a fine conductive wire-embedded plate 110 mounted in the bottom of the device receiving carrier 100 and serving as an IC socket and the electrical connection between the fine conductive wire-embedded plate 110 and electric conductor pads 72 mounted in the board 70 of the test head.

Since the device receiving carrier 100 shown in FIG. 1 has the entire bottom of its IC pocket 101 open to form a rectangular opening 102, the ball terminals 41 of the BGA package 40 are all exposed through the undersurface of the device receiving carrier 100, irrespective of where on the bottom of the BGA package 40 the ball terminals 41 may be disposed, and even if the ball terminals 41 are disposed all over the bottom surface of the BGA package. The opening 102 in the bottom of the device receiving carrier 100 is closed by the fine conductive wire-embedded plate 110.

The wall of the IC pocket 101 in the device receiving carrier 100 has its lower inner surface undercut to form a thin-walled, downwardly protruding, lower fine conductive wire-embedded plate retaining portion 103. The fine conductive wire-embedded plate retaining portion 103 has a fine conductive wire-embedded plate holding groove formed all around the inner wall surface of the fine conductive wire-embedded plate portion 103 at its root, whereby upon being forced inwardly up through the opening 102 of the IC pocket 101, the fine conductive wire-embedded plate 110 is caused to fit in and be firmly retained by the fine conductive wire-embedded plate holding groove as it is prevented from being moved upwardly any further by the downwardly facing overhanging surface portion of the inner wall of the IC pocket 101. The fine conductive wire-embedded plate 110 is thus mounted to the bottom of the device receiving carrier 100 and closes the opening 102.

According to the present invention, the fine conductive wire-embedded plate 110 is made to have the function of the conventional IC socket. Thus, in the present invention, IC sockets are provided on the device receiving carrier for carrying IC packages thereon rather than on the test head of the IC tester as is the case with the prior art IC tester described above.

The fine conductive wire-embedded plate 110 comprises an electric insulator plate or sheet, preferably a resilient electric insulator plate or sheet 111 and a multiplicity of fine electrically conductive wires 112 embedded in the insulator plate 111, the conductive wires extending parallel to each other and without contacting each other through the thickness of the insulator plate with the opposite ends exposed at the outer surfaces of the insulator plate. The fine conductive wires 112 are very thin in diameter and arranged at very close intervals on the order of 0.1 mm.

In this embodiment, a resilient rubber plate or sheet is used as the insulator plate 111, and fine wires made of a metal such as copper, silver, gold or the like is used as the fine conductive wires. Therefore, in the following description the insulator plate 111 will be referred to as a rubber plate and the fine conductive wires will be referred to as fine metal wires.

With the construction of the fine conductive wire-embedded plate 110 as described above, upon the BGA package 40 being placed on one surface (the top surface) of the fine conductive wire-embedded plate 110, each of the ball terminals 41 of the BGA package 40 comes into contact with a minute area portion on the top surface of the fine conductive wire-embedded plate 110. Since each of the minute area portions contains a plurality of fine metal wires 112, each ball terminal 41 is electrically extended through the metal wires 112 out to the bottom surface of the fine conductive wire-embedded plate 110 with the ball terminals 41 being electrically insulated from each other. If an appropriate conductor is provided at the minute area portion on the bottom surface of the fine conductive wire-embedded plate 110 opposing each ball terminal 41 of the BGA package 40, the ball terminals 41 will be electrically connected with the conductors provided at the bottom surface of the fine conductive wire-embedded plate 110 with the ball terminals being electrically insulated from each other. It is thus to be appreciated that the fine conductive wire-embedded plate 110 performs the same function as the conventional IC socket with the fine metal wires 112 contained in each of the minute area portions functioning like the socket terminals.

Figure 10:
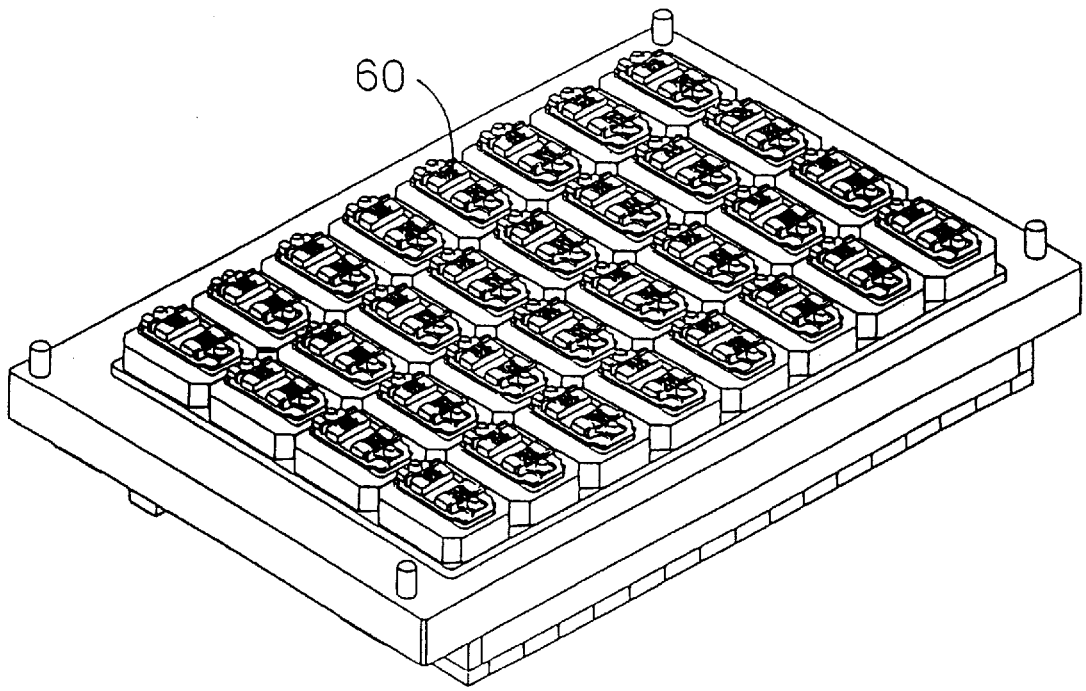
FIG. 10 is a perspective view showing an example of the conventional IC socket.
Figure 11:
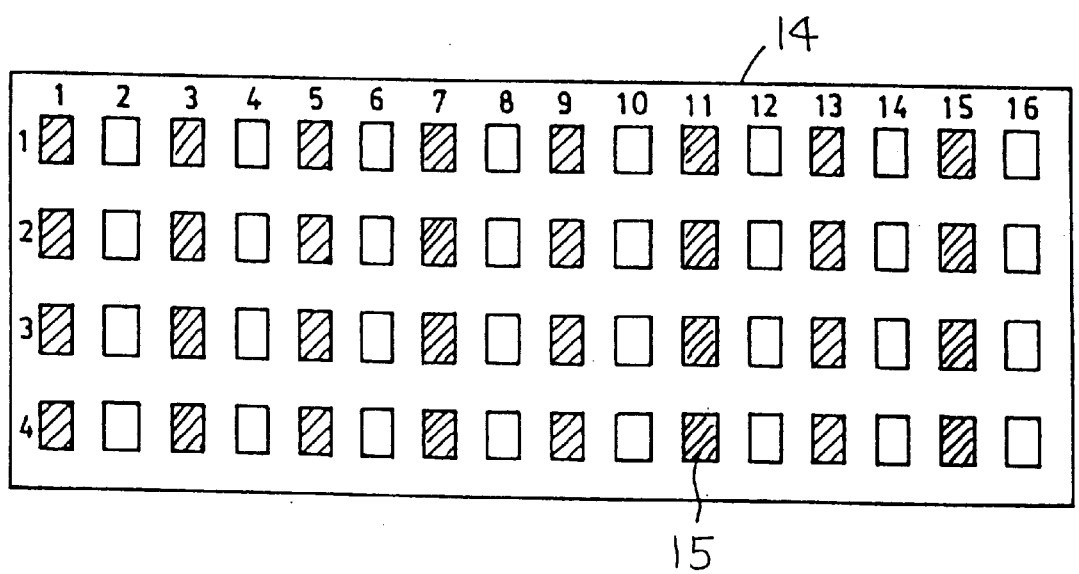
FIG. 11 is a diagrammatical illustration illustrating the manner in which the semiconductor devices loaded on the test tray of FIG. 8 are tested by the use of the IC sockets shown in FIG. 10.
Figure 13:
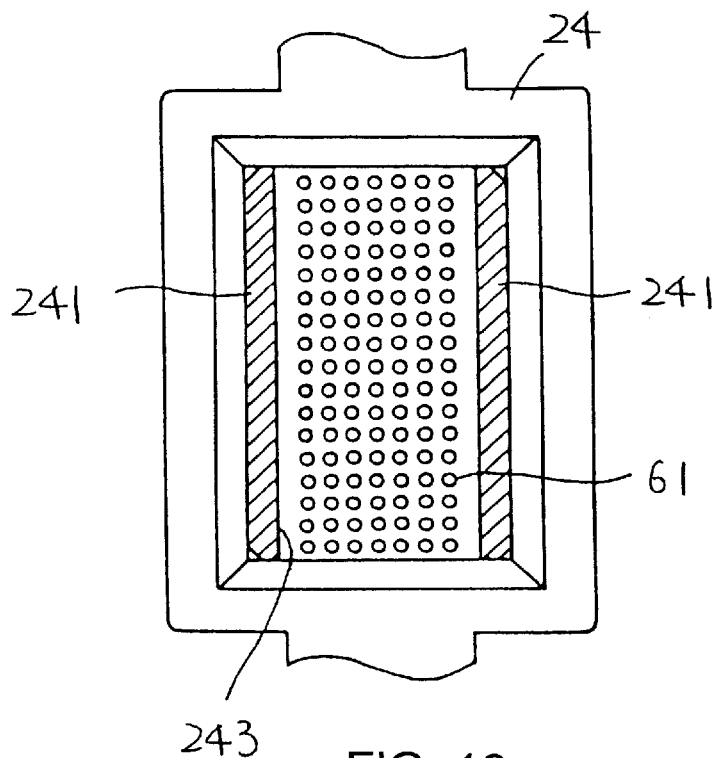
FIG. 13 is a top plan view of the device receiving carrier shown in FIG. 12.
Figure 12:
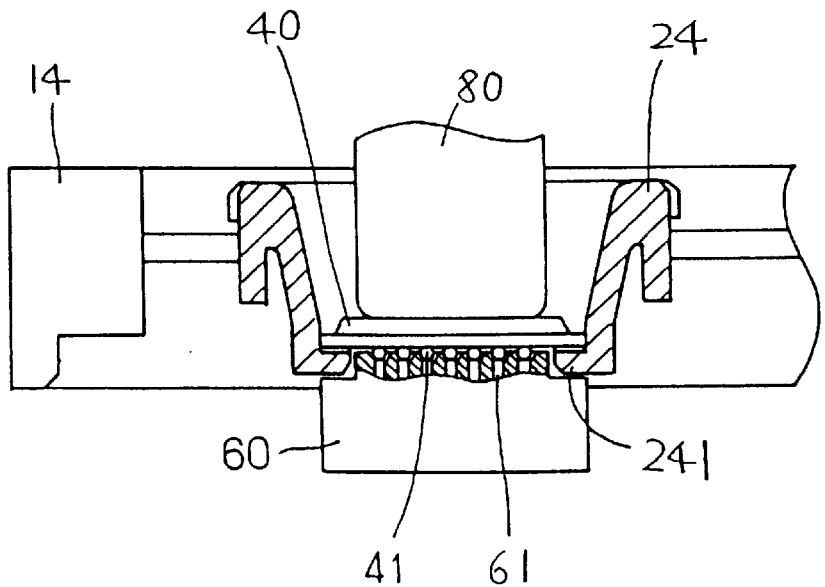
FIG. 12 is a schematic cross-sectional view illustrating the electrical connection between a BGA package loaded on the device receiving carrier and an IC socket.
Figure 15:
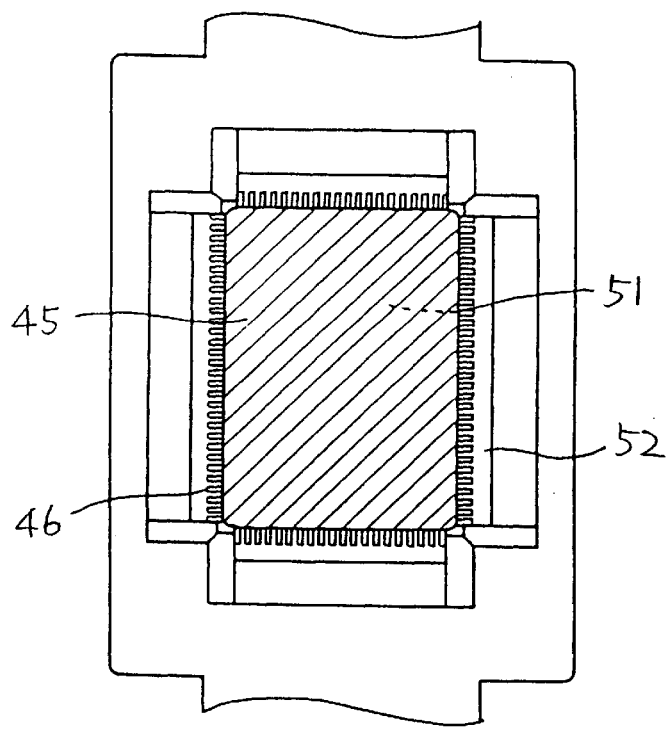
FIG. 15 is a top plan view of the device receiving carrier and QFP package shown in FIG. 14.
Figure 14:
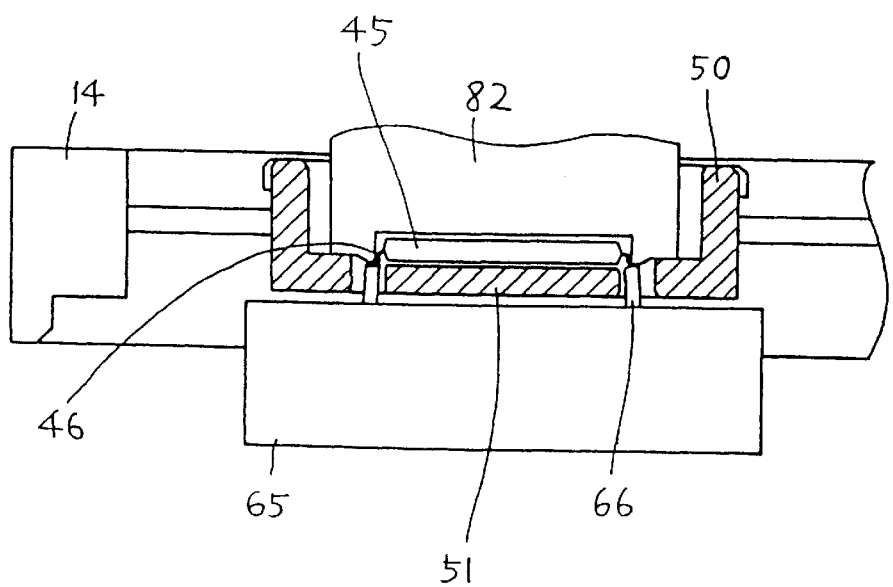
FIG. 14 is a schematic cross-sectional view illustrating the electrical connection between a QFP package loaded on the device receiving carrier and an IC socket.

FIG. 1 illustrates an embodiment in which a pad of good conductor (a gold pad 72 in this example) is provided at the minute area portion on the bottom surface of the fine conductive wire-embedded plate 110 opposing each ball terminal 41 of the BGA package 40, these gold pads 72 being formed in the surface of the board 70 of the test head. Since the board 70 insulatively support the gold pads 72 functioning like the IC socket terminals, a plurality of gold pads 72 are arrayed in a matrix of four rows (lateral rows)×eight columns (longitudinal rows) on the test head 90, just like the IC sockets 60 shown in FIG. 10 and as is seen from FIG. 6. It is needless to say that the number of gold pads 72 mounted on the test head 90 depends upon the number of ICs that can be tested at a time in one IC tester.

As can be appreciated from FIG. 1, each board 70 has multi-layered wiring patterns (shown in thick solid lines) formed therein. The gold pads 72 formed in the surface of the board 70 are electrically connected with the corresponding wiring patterns which are in turn connected through the test head 90 with the IC tester body. While the gold pad 72 is formed in the shape of small circle or small ellipse so as to conform with the shape of the ball terminal 41 of the BGA package 40, it may of course be of any other suitable shape.

Device receiving carriers 100 each having a fine conductive wire-embedded plate 110 mounted in the bottom thereof are attached to a test tray 14, and then in the loader section 11, BGA packages 40 housing ICs to be tested are placed and supported in the IC pockets 101 of the respective device receiving carriers 100. Since the shape and size of the IC pocket 101 are determined according to the shape and size of the IC package as explained hereinbefore, the BGA packages 40 placed in the IC pockets are supported therein in a stable manner with the ball terminals 41 facing downwardly.

The test tray 14 is transported to the test section 21 within the constant temperature chamber 20 where upon the fine conductive wire-embedded plate 110 of each device receiving carrier 100 being brought into contact with the corresponding board 70 attached to the test head, each of the ball terminals 41 of the BGA package 40 is electrically connected through the fine conductive wire-embedded plate 110 with the corresponding gold pad 72 of the board 70, as shown in FIG. 1. That is, each ball terminal 41 is put into good electrical connection with the gold pad 72 in contact with the minute area portion on the bottom surface of the fine conductive wire-embedded plate 110 through a plurality of fine metal wires 112 embedded in the minute area portion on the top surface of the fine conductive wire-embedded plate 110.

It is to be understood that when a certain amount of pressure is applied to the fine conductive wire-embedded plate 110, the plate is easily deformed (indented) by virtue of the resiliency of the rubber plate 111 to insure the contact between the overlying ball terminals 41 of the BGA package 40 and the underlying gold pads 72 by means of the fine metal wires 112 to thereby enhance the reliability in operation of the rubber plate. As is the case with the prior art, therefore, a pusher 80 is mounted above the test head, the arrangement being such that the pusher 80 pushes the associated BGA package 40 in the IC pocket 101 from above down to press the fine conductive wire-embedded plate 110 through the ball terminals 41.

It is thus to be appreciated that the ball terminals 41 of the BGA package 40 are electrically connected with the gold pads 72 of the board 70 through the fine metal wires 112 of the fine conductive wire-embedded plate 110 satisfactorily and with high reliability, even if the ball terminals 41 are disposed all over the bottom surface of the BGA package accompanied naturally by enhancement in the integration level and an increase in the number of lead pins. This allows for conducting the test on ICs in BGA packages consistently and with high reliability without the need for providing IC sockets in the test head as in the prior art.

In addition, it is possible to avoid reduction in the mechanical strength of the device receiving carrier 100 because the device receiving carrier is configured to carry and support a BGA package 40 on the fine conductive wire-embedded plate 110 attached to the carrier. Further, the fine conductive wire-embedded plate 110 which performs the function of the IC socket makes it possible to provide an IC tester capable of applying high frequency signals due to a substantial reduction in thickness of the IC socket.

Moreover, when the type of the IC package to be tested is changed, the device receiving carrier 100 may be replaced outside of the constant temperature chamber 20 because the device receiving carrier is mounted to the test tray 14 which is moved through the IC tester in a circulating manner. This avoids occurrence of a change in the temperature in the constant temperature chamber 20 as well as enhancing the operating simplicity, so that only a short time interruption of the test is required before the testing can be resumed.

Figure 2:
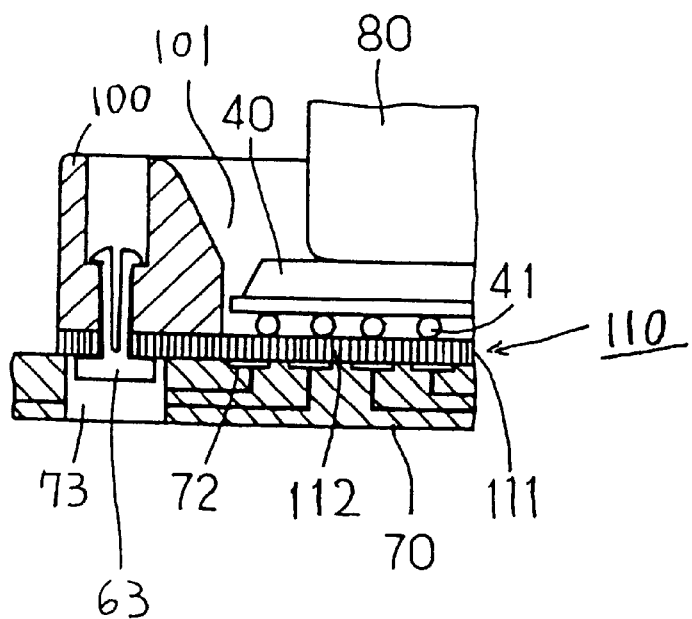
FIG. 2 is a schematic cross-sectional view showing a modified form of the first embodiment illustrated in FIG. 1.

While in the first embodiment the wall of the IC pocket 101 in the device receiving carrier 100 is formed all around the inner surface with a fine conductive wire-embedded plate holding groove so that the fine conductive wire-embedded plate 110 may be affixed to the bottom of the device receiving carrier 100 by being fitted in the fine conductive wire-embedded plate holding groove, it will be appreciated that essentially the same functional advantages as provided by the first embodiment may be obtained by a modified arrangement in which the fine conductive wire-embedded plate 110 is secured to the undersurface of the device receiving carrier 100 by means of fasteners 63 as illustrated in FIG. 2.

According to the constructions of the first embodiment and the modified form illustrated in FIGS. 1 and 2, respectively, the fine conductive wire-embedded plate 110 may easily be secured to or removed from the groove in the lower inner wall surface or the undersurface of the device receiving carrier 100, so that when the type of the IC package to be tested has been changed, it is only required to replace the fine conductive wire-embedded plate 110 to thereby provide the advantage of further enhancing the operational efficiency. On the other hand, however, because of the configuration in which the fine conductive wire-embedded plate 110 is affixed to the groove in the lower inner wall surface or the undersurface of the device receiving carrier 100, it is required to form in the board 70 a recess or through-hole 71 for receiving the lower end portion of the device receiving carrier 100 and through-holes 73 for passing the fasteners 63 in the arrangements of FIGS. 1 and 2, respectively.

Figure 3:
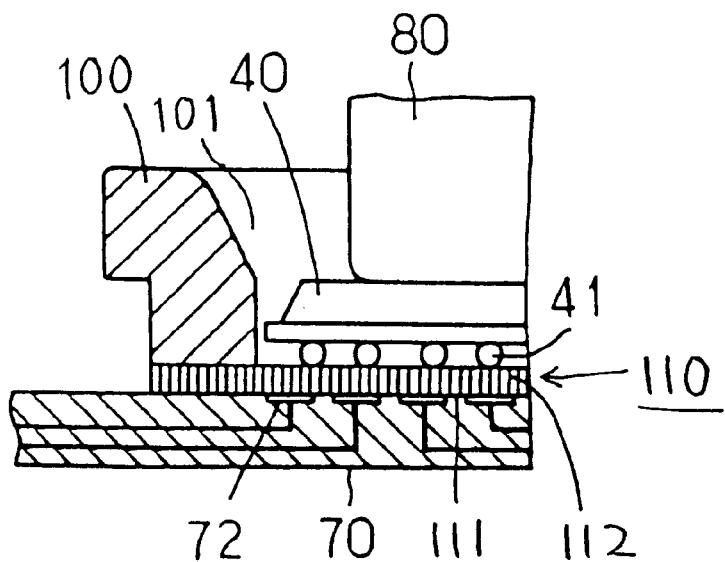
FIG. 3 is a schematic cross-sectional view showing an another modified form of the first embodiment illustrated in FIG. 1.

FIG. 3 illustrates another modified form of the first embodiment of FIG. 1 in which the fine conductive wire-embedded plate 110 is secured to the undersurface of the device receiving carrier 100 by means of suitable adhesive. In this case as well, it is a matter of course that essentially the same functional advantages as provided by the first embodiment may be obtained.

It should be noted that in the modified from shown in FIG. 3 it is not possible to replace only the fine conductive wire-embedded plate 110, although there is no need to form any recess or through-holes in the board 70.

Figure 4:
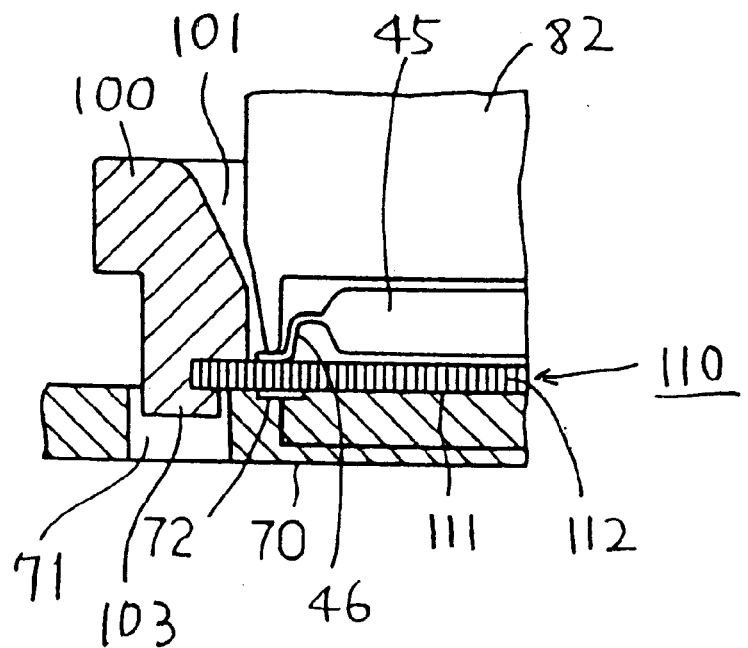
FIG. 4 is a schematic cross-sectional view showing the pertinent portions of a second embodiment of the semiconductor device testing apparatus according to the present invention.

FIG. 4 shows the pertinent portions of a second embodiment of the IC tester according to the present invention which is applicable when the IC packages placed and supported in IC pockets 101 of a device receiving carrier 100 are QFP packages. It is a schematic cross-sectional view illustrating the electrical connection between a QFP 45 loaded on the device receiving carrier 100 and a fine conductive wire-embedded plate 110 mounted in the bottom of the device receiving carrier 100 and serving as an IC socket and the electrical connection between the fine conductive wire-embedded plate 110 and gold pads 72 formed on the board 70 of the test head.

Since the construction of the device receiving carrier 100 is the same as that of the device receiving carrier shown in FIG. 1 for use with the BGA package 40 except that the shape and size of the IC pocket 101 are determined according to the shape and size of the QFP, the numerals in FIG. 4 correspond to those of FIG. 1 for the elements common to both, and those common elements will not be discussed again unless needed.

Likewise, with regard to the board 70, the numerals in FIG. 4 correspond to those of FIG. 1 for the elements common to both, and the description thereof is omitted, since the board 70 mounted to the test head is identical to that shown in FIG. 1 for use with the BGA package 40 except that the gold pads 72 formed in the board 70 are arrayed in correspondence with the terminal pins 46 leading from the sides of the QFP 45 and that the multi-layered wiring patterns (shown in thick solid lines) in the board 70 are formed in accordance with the array of the gold pads 72. It is needless to say that while the gold pads 72 are formed in the shape of a rectangle to conform with the shape of the end portion of the terminal pin 46 of the QFP 45, it may be of any other suitable shape.

In this second embodiment as well, a pusher 82 for applying a certain amount of pressure to the fine conductive wire-embedded plate 110 is mounted above the test head, as is the case with the prior art, in order to insure the contact between the end portions of the overlying terminal pins 46 of the QFP 45 and the underlying gold pads 72 by means of the fine metal wires 112 to thereby enhance the reliability in operation of the rubber plate, the arrangement being such that the pusher 82 pushes the end portions of the terminal pins 46 of the associated QFP 45 in the IC pocket 101 from above down to press the fine conductive wire-embedded plate 110 through the end portions of the terminal pins 46.

With regard to the second embodiment as well, it is evident that constructions similar to those in the modified forms illustrated in FIGS. 1 and 2 may be adopted with respect to the manner of mounting the fine conductive wire-embedded plate 110 to the device receiving carrier 100. Specifically, the fine conductive wire-embedded plate 110 may be secured to the undersurface of the device receiving carrier 100 by means of either fasteners 63 or suitable adhesive.

When the device receiving carrier 100 having a fine conductive wire-embedded plate 110 mounted in the bottom thereof is attached to a test tray 14, the QFP 45 placed in the IC pocket 101 is supported therein in a stable manner with the terminal pins 46 in contact with the surface of the fine conductive wire-embedded plate 110, since the shape and size of the IC pocket 101 are determined according to the shape and size of the IC package.

The test tray 14 is transported to the test section 21 within the constant temperature chamber 20 where upon the fine conductive wire-embedded plate 110 of each device receiving carrier 100 being brought into contact with the corresponding board 70 attached to the test head, each of the terminal pins 46 of the QFP 45 is electrically connected through the fine conductive wire-embedded plate 110 with the corresponding gold pad 72 of the board 70, as shown in FIG. 4. That is, each terminal pin 46 is put into good electrical connection with the gold pad 72 in contact with the minute area portion on the bottom surface of the fine conductive wire-embedded plate 110 through a plurality of fine metal wires 112 embedded in the minute area portion on the top surface of the fine conductive wire-embedded plate 110. In this position, the pusher 82 is actuated to push the end portions of the corresponding terminal pins 46 from above down to press the fine conductive wire-embedded plate 110 through the end portions of the terminal pins 46.

It is thus to be appreciated that the terminal pins 46 of the QFP 45 are electrically connected with the gold pads 72 of the board 70 through the fine metal wires 112 of the fine conductive wire-embedded plate 110 satisfactorily and with high reliability, whereby the test on ICs in QFPs may be conducted consistently and with high reliability without the need for providing IC sockets on the test head as in the prior art.

In addition, it is possible to avoid reduction in the mechanical strength of the device receiving carrier 100 because there is no need to form four slits through the bottom of the device receiving carrier 100. Further, the fine conductive wire-embedded plate 110 which performs the function of the IC socket makes it possible to provide an IC tester capable of applying high frequency signals owing to a substantial reduction in thickness of the wire-embedded plate.

Moreover, when the type of the IC package to be tested is changed, the device receiving carrier 100 may be replaced outside of the constant temperature chamber 20 because the device receiving carrier is mounted to the test tray 14 which is moved through the IC tester in a circulating manner. This avoids occurrence of a change in the temperature in the constant temperature chamber 20 as well as enhancing the operating simplicity, so that only a short time interruption of the test is required before the testing can be resumed.

Figure 5:
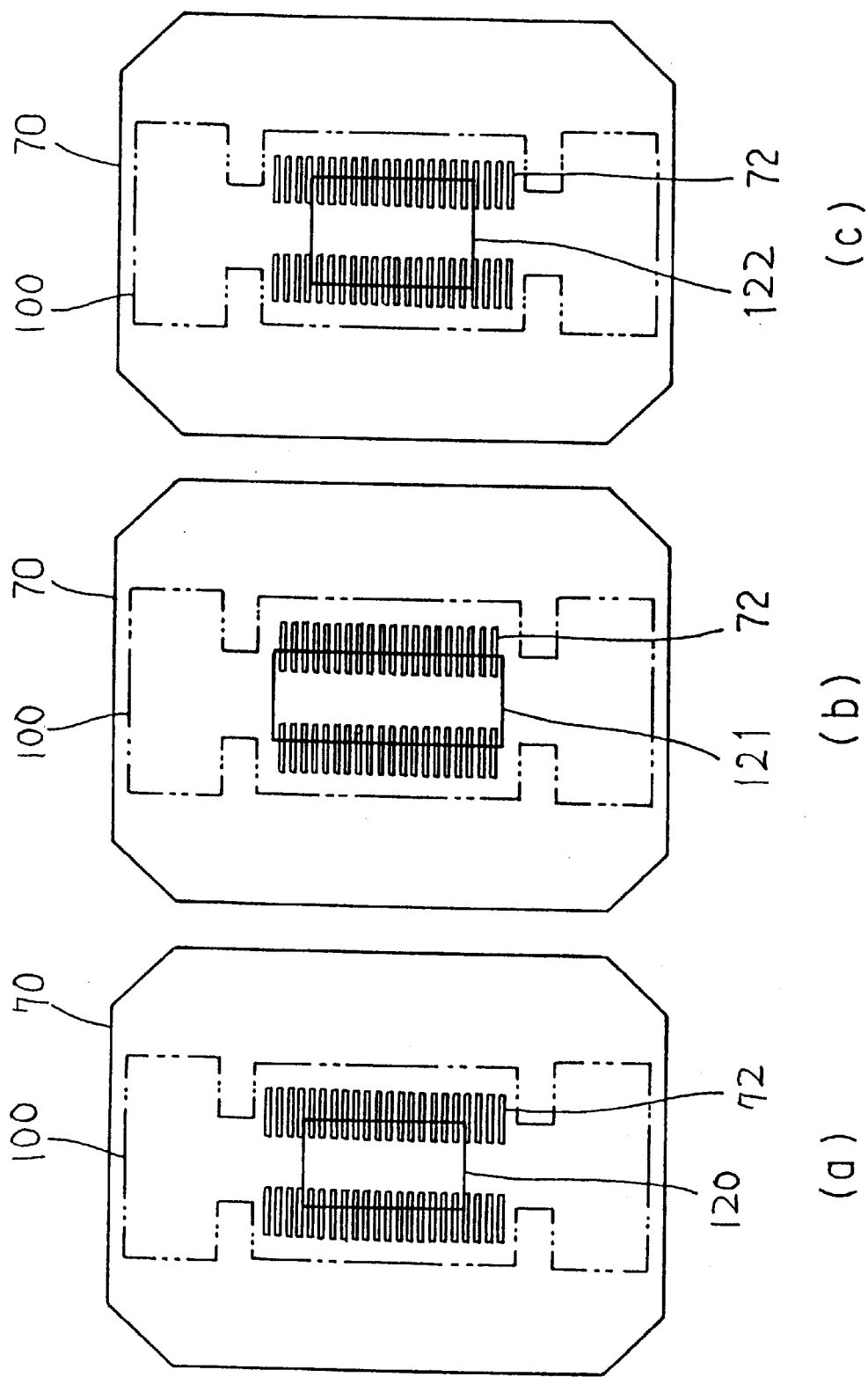
FIG. 5 is a plan view of an embodiment of the gold pads mounted in the board of the test head of the semiconductor device testing apparatus according to the present invention.

FIG. 5 illustrates a pattern of gold pads 72 formed in the board 70 suitable for use in placing and supporting a TSOP on a device receiving carrier 100. The TSOP is a surface mount type package comprising a thin rectangular package body having lead pins protruding horizontally and parallel to each other from its two opposed sides. While the package is rectangular or square in shape, there are a number of variations in the outer dimensions and the number of lead pins. For this reason, in forming two transversely spaced apart rows of rectangular minute gold pads in the surface of the board 70, the length of each gold pad row (the length from one end to the other of each row) is chosen to accommodate all of the lead pins of TSOP having the maximum length of lead pin array. Further, the longitudinal length of each gold pad (the length in the right-to-left direction as viewed in the drawing) of each gold pad is made as long as possible. The spacing (pitch) between adjacent gold pads in each row is chosen to be equal to or less than the minimum pitch of the lead pins of the TSOP.

With a selected pattern of gold pads 72 formed in the surface of the board 70, when the fine conductive wire-embedded plate 110 mounted to the device receiving carrier 100 is engaged with the surface of the board 70 in the test section 21, a TSOP 120 having standard outer dimensions will be positioned with respect to the gold pad pattern as shown in FIG. 5(*a*), so that the lead pins will be put into contact with the individual gold pads 72 at their longitudinal middle portions except for a few gold pads located at the opposite ends of each gold pad row. For a TSOP 121 having the maximum length of lead pin array, it will be positioned with respect to the gold pad pattern as shown in FIG. 5(*b*), so that the lead pins will be contacted with all the gold pads 72 at their longitudinal middle portions in each gold pad row. Further, for a TSOP 122 having the standard length but the greater width of lead pin array (wider than the standard), it will be positioned with respect to the gold pad pattern as shown in FIG. 5(*c*), so that the lead pins will be contacted with the same gold pads 72 as in the case of FIG. 5(*a*) but toward the longitudinal outer end portions of the individual gold pads.

It will thus be appreciated that an excellent efficiency can be realized by the advantage of utilizing the same board 70 even if the type of TSOP to be tested is changed.

For testing ICs housed in BGA packages as discussed above, it is again preferable that minute circular or elliptical gold pads 72 be formed all over the surface area of the board 70 corresponding to the undersurface area of the maximum size BGA package to accommodate BGA package of all sizes. This eliminates the need to replace the board 70 whenever the type of TSOP to be tested is changed. It is apparent that the gold pads 72 in the surface the board 70 may be substituted for by pads formed of conductor other than gold or by terminal elements.

Figure 6:
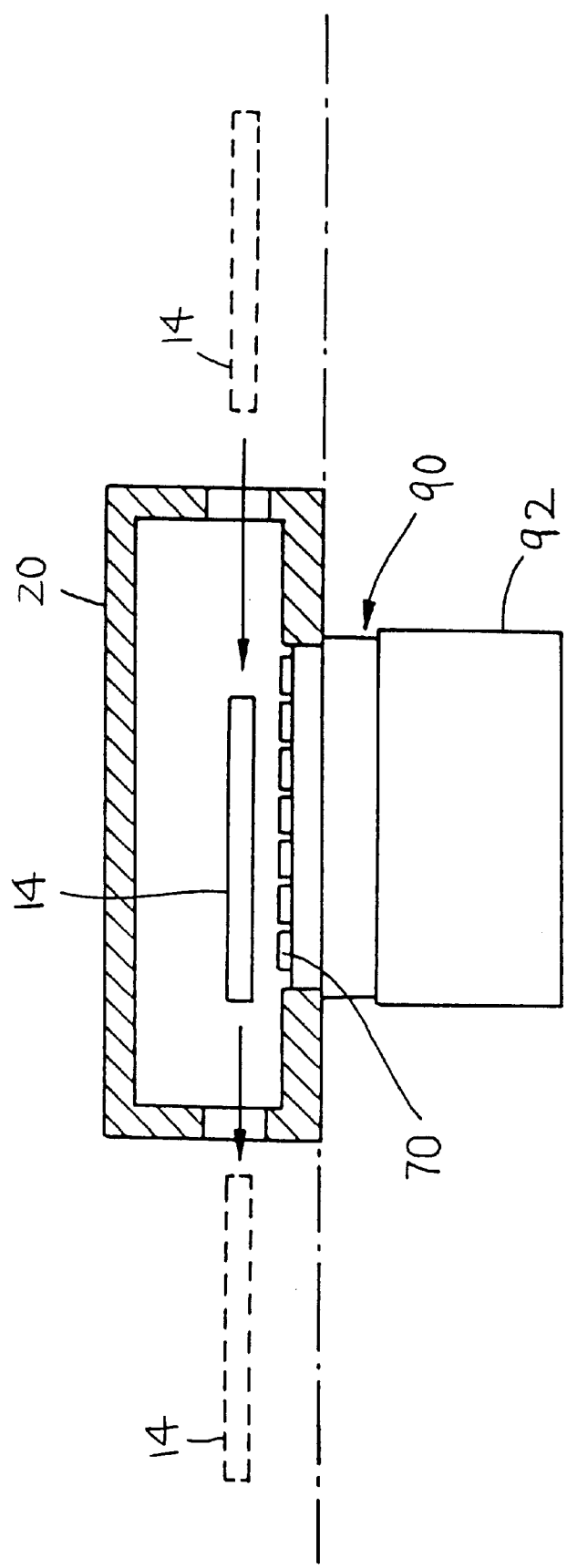
FIG. 6 is a schematic side view illustrating the positional relation between the constant temperature chamber of the handler and the semiconductor device testing apparatus according to the present invention with the constant temperature chamber being shown in a cross-sectional view.
Figure 7:
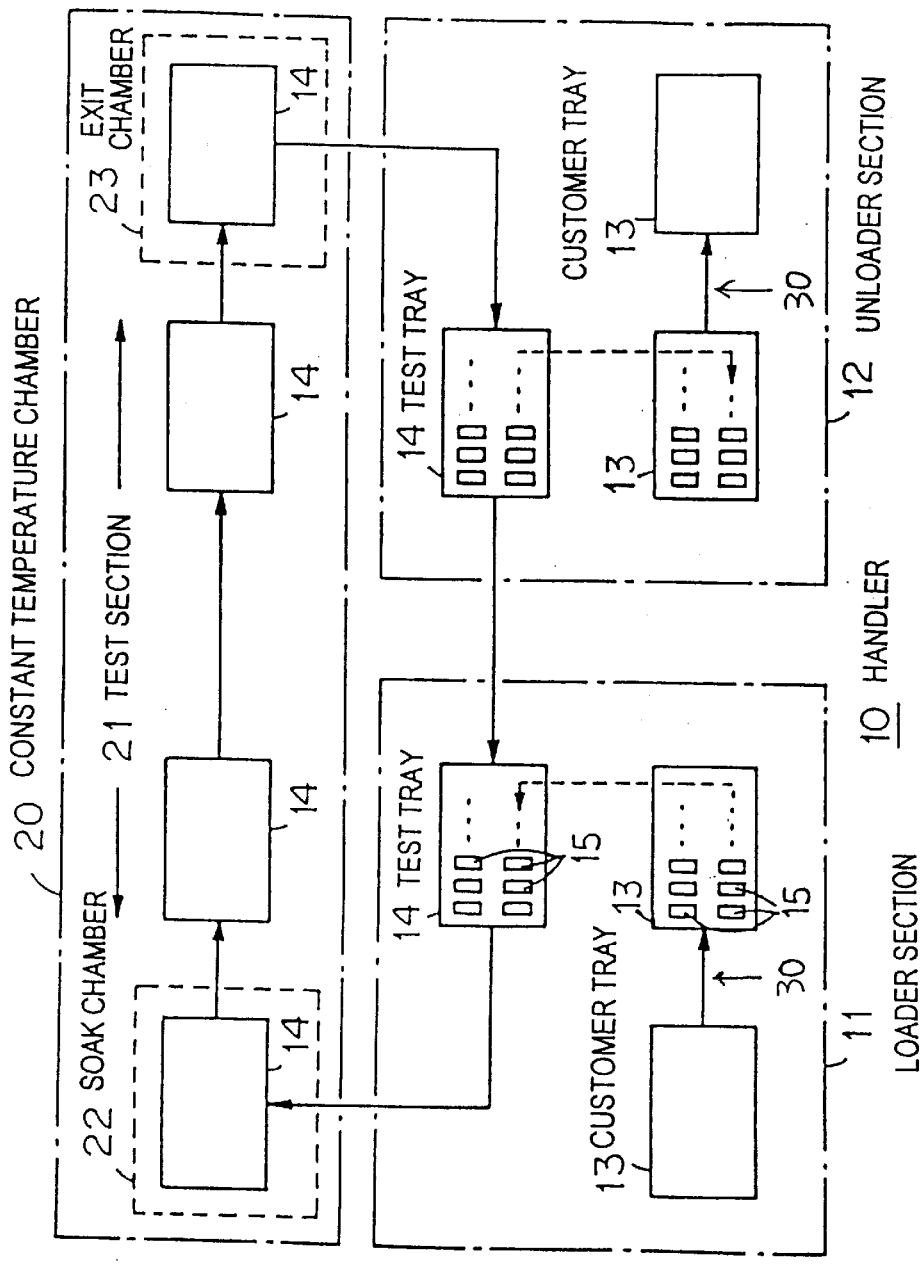
FIG. 7 is a diagrammatical illustration of the general arrangement of an example of the handler of the conventional horizontal transporting type in the form of a flow chart.
Figure 8:
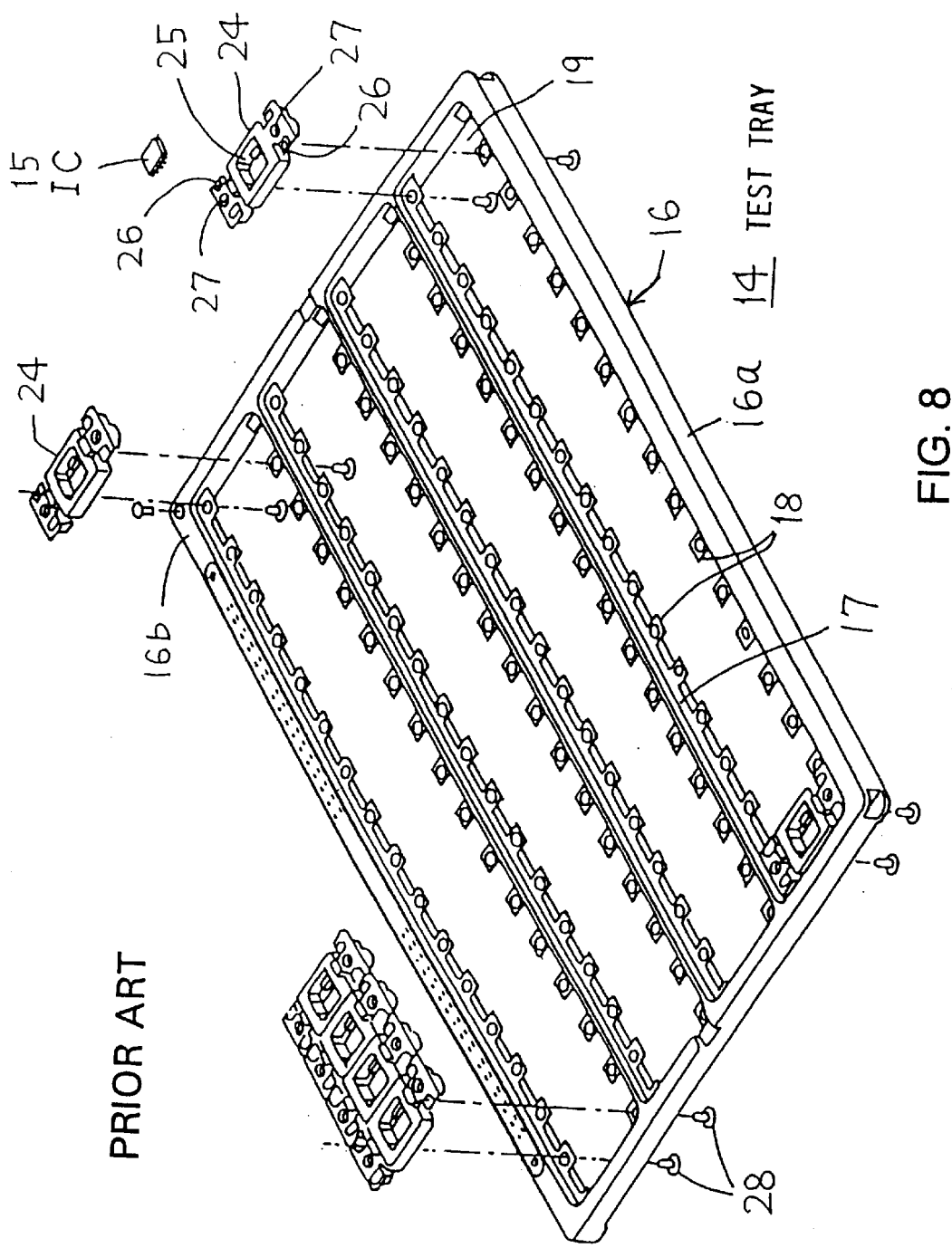
FIG. 8 is a perspective view showing an example of the conventional test tray.
Figure 9:
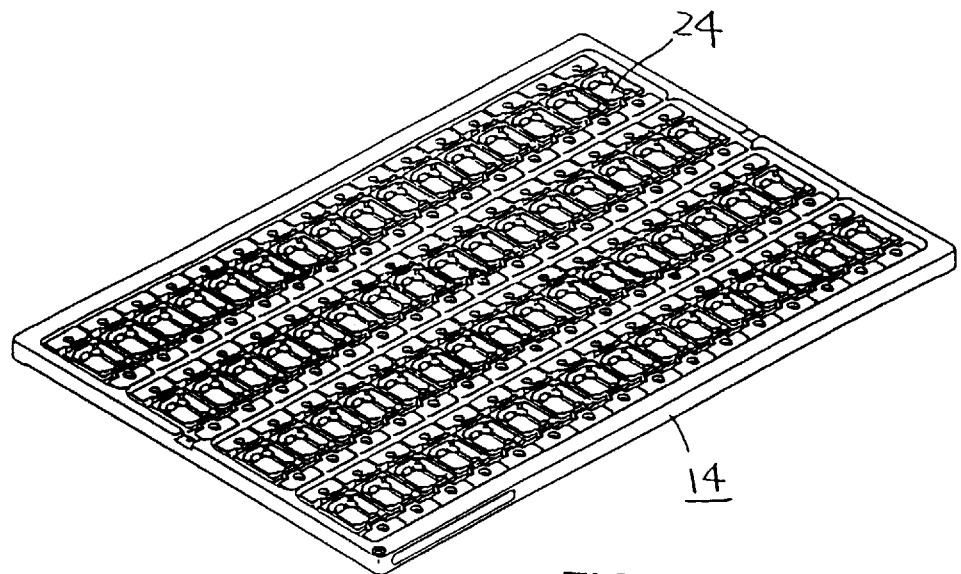
FIG. 9 is a perspective view showing the test tray of FIG. 8 having device receiving carriers mounted thereto.

It should be noted that the test head 90 shown in FIG. 6 is configured to be able to change the electrical connection with respect to the board 70 by replacing the circuit board of the test head base 92. Accordingly, even if the change of type of TSOP to be tested necessitates changing the electrical connection with respect to the board 70, it is only required to replace the circuit board of the test head located outside of the constant temperature chamber 20, which contributes to improving the operational efficiency.

While the foregoing embodiments have been described in connection with the case where the invention is applied to an IC tester, it is obvious to those skilled in the art that the present invention is applicable, with the same functional advantages, to various types of semiconductor device testing apparatus adapted for testing other types of semiconductor devices other than ICs. In addition, while the present invention has been described with respect to testing ICs in BGA package, QFP and TSOP carried and transported on a device receiving carrier, it is apparent that the present invention is applicable, with the same functional advantages, to testing ICs housed in other packages and other types of semiconductor devices.

As is appreciated from the foregoing discussion, according to the present invention the device receiving carrier is provided with the fine conductive wire-embedded plate 110 which is made to have the function of the conventional IC socket, whereby the need to provide IC sockets on the test head as was required of the prior art is eliminated. Consequently, there is no need to replace IC sockets on the test head when the type of semiconductor device to be tested is changed. In addition, since the replacement of device receiving carriers and/or fine conductive wire-embedded plates is effected by very easy operations outside of the constant temperature chamber, the interruption of the testing occasioned by the change of the type of semiconductor device to be tested is only a short time, leading to a great reduction in the testing time as well as a significant improvement on the operational easiness.

Moreover, because of a semiconductor device carried on a device receiving carrier being rested and supported on the fine conductive wire-embedded plate, even an increase in the number of terminals of the IC package would neither deprive the device receiving carrier of the portion for carrying the semiconductor device, nor extremely reduce the mechanical strength of that portion, not to speak of the mechanical strength of the device receiving carrier per se. On top of that, the ability of the fine conductive wire-embedded plate to perform the function of the IC socket means that a very thin socket can be provided, which in turn makes it possible to provide an IC tester capable of applying high frequency signals.

Furthermore, the present invention provides the advantage of insuring that the terminals of the semiconductor device, irrespective of the number of terminals, may be reliably connected with the conductor pads or terminals in the board of the test head, because the device receiving carrier is configured to be supported on the fine conductive wire-embedded plate such that the terminals of the semiconductor device are connected with the conductor pads or terminals in the board through the fine conductive wires embedded in the rubber sheet.

What is claimed is:

1. A semiconductor device testing apparatus constructed such that in a loader section, semiconductor devices to be tested are retained each in each of device receiving carriers mounted to a test tray, said test tray being then transported from said loader section to a test section where the semiconductor device is tested for its electrical characteristic while placed on the test tray, and upon completion of the test, the tested semiconductor device together with the test tray is transported out of the test section, in which:

each said device receiving carrier has
   its top and bottom both of which are open, and
   a fine conductive wire-embedded member mounted to the open bottom of the device receiving carrier so as to close the open bottom whereby said carrier is capable of receiving the semiconductor device to be tested through the open top and accommodating the semiconductor device on the wire-embedded member, said fine conductive wire-embedded member comprises
   an insulator plate and
   a number of fine conductive wires embedded in the insulator plate, said fine conductive wires being electrically insulated from each other and extending through the thickness of the insulator plate with the opposite ends exposed at opposed upper and bottom surfaces of the insulator plate, and when said semiconductor device to be tested having a plurality of terminals is rested on said fine conductive wire-embedded member, upper ends of one or more of the fine conductive wires exposed at the upper surface of the insulator plate are individually contacted to each of the terminals of said semiconductor device, so that said fine conductive wire-embedded member functions as bottom support means for carrying thereon said semiconductor device during transportation of the same and also functions as a socket for contacting to the respective terminals of said semiconductor device during the testing.

2. The semiconductor device testing apparatus according to claim 1 in which said fine conductive wire-embedded member is securedly fitted in a groove formed in the inner wall of the lower portion of said device receiving carrier.

3. The semiconductor device testing apparatus according to claim 1 in which said fine conductive wire-embedded member is secured to the bottom of said device receiving carrier by fastener means.

4. The semiconductor device testing apparatus according to claim 1 in which said fine conductive wire-embedded member is securely bonded to the bottom of said device receiving carrier by suitable adhesive.

5. The semiconductor device testing apparatus according to claim 1 in which a spacing between mutually adjacent two fine conductive wires of said fine conductive wire-embedded member is chosen to be 0.1 mm or approximately 0.1 mm.

6. The semiconductor device testing apparatus according to claim 1 in which the insulator plate of said fine conductive wire-embedded member is a resilient rubber plate or sheet, and said fine conductive wires are fine metal wires.

7. The semiconductor device testing apparatus according to claim 1 in which a test head of the semiconductor device testing apparatus has insulator connection boards mounted thereto wherein each of said connection boards is adapted to be in contact with the bottom surface of one of said fine conductive wire-embedded members mounted to the test tray during the testing of the semiconductor device in said test section, and each said connection board has a plurality of conductor pads formed to be electrically insulated from each other on an upper surface thereof at a position correspondingly opposing to each of the terminals of the corresponding semiconductor device placed on the top surface of the fine conductive wire-embedded member thereby to establish electrical connection between said terminals of the semiconductor device and the corresponding conductor pads of said connection board through the fine conductive wires of said fine conductive wire-embedded member.

8. The semiconductor device testing apparatus according to claim 7 in which said conductor pads formed on the surface of said board are gold pads.

9. The semiconductor device testing apparatus according to claim 7 in which said board has multi-layered wiring patterns formed therein, said conductor pads formed on the surface of the board being electrically connected with the corresponding wiring patterns.

10. The semiconductor device testing apparatus according to claim 7 in which said semiconductor device to be tested is housed in a package of the surface mount type having terminals protruding parallel to each other from its two opposed sides, said conductor pads are formed on two rows spaced apart by a predetermined distance in the surface of said board, each row including a multiplicity of conductor pads, the pitch of the conductor pads in each row corresponding with that of the terminals of said semiconductor device to be tested, and each conductor pad being elongated in a direction perpendicular to the longitudinal direction of the row.

11. The semiconductor device testing apparatus according to claim 10 in which said package of the surface mount type is TSOP.

12. The semiconductor device testing apparatus according to claim 7 in which said semiconductor device to be tested is housed in a package of the surface mount type having terminals protruding parallel to each other from its four sides, said conductor pads being formed on the surface of said board at the positions opposing the respective terminals of the semiconductor device being tested.

13. The semiconductor device testing apparatus according to claim 12 in which said package of the surface mount type is QFP.

14. The semiconductor device testing apparatus according to claim 7 in which said semiconductor device to be tested is housed in a package of the ball grid array structure having small solder balls arrayed in the form of a grid on the bottom thereof, said conductor pads being formed on the surface of said board at the positions opposing the respective solder balls.

15. The semiconductor device testing apparatus according to claim 7 in which the test head has a circuit board with which said wiring patterns of said board mounted to the test head are adapted to be connected, said circuit board being replaceable in accordance with a change of the type of semiconductor device to be tested.

16. A semiconductor device testing apparatus comprising:

a test tray transported into and out of a test section of said testing apparatus and carrying thereon semiconductor devices to be tested each of which has a plurality of lead terminals; and a test head positioned in the test section and connected to the respective semiconductor devices during testing thereof; wherein said test tray having a plurality of device receiving carriers, said test head having a plurality of insulator connection boards, each of said device receiving carriers has
its top and bottom both of which are open, and
a fine conductive wire-embedded member which is mounted to the device receiving carrier so as to close the open bottom thereof to thereby form a pocket for receiving therein the semiconductor device through the open top whereby resting the semiconductor device on the wire-embedded member, said fine conductive wire-embedded member comprises
an insulator plate, and
a plurality of fine conductive wires embedded in the insulator plate, said fine conductive wires being electrically insulated from each other and extending through the thickness of the insulator plate with the opposite upper and bottom ends thereof exposed at opposed upper and bottom surfaces of the insulator plate, the upper end of each of said fine conductive wires exposed at the upper surface of the insulator plate has an upper exposed surface area which is smaller than a bottom area of each of the lead terminals of the semiconductor device contacted to the fine conductive wire-embedded member when rested in the pocket, said fine conductive wires are so closely and uniformly embedded in the insulator plate that one or more of the upper ends of the fine conductive wires are capable of contacting to the bottom area of each of the lead terminals of the semiconductor device resting on the fine conductive wire-embedded member, each of said insulator connection boards has
a plurality of conductor pads disposed on an upper surface of the insulator connection board, and
connection lead wires each connected to each of said conductor pads, each of said insulator connection boards is prepared in correspondence to each kind of the semiconductor devices and interchangeably mounted to the test section so as to meet with the semiconductor device of the corresponding kind to be transported in the test section, and each of the conductor pads of each said insulator connection board has an upper exposed area which is substantially same as the bottom area of each lead terminal of the corresponding semiconductor device, and disposed at such a corresponding position that each pad opposes to each lead terminal interposing the fine conductive wire-embedded member therebetween, whereby said fine conductive wire-embedded member functions as bottom support means for carrying thereon said semiconductor device during transportation thereof and also functions as a socket for contacting the respective lead terminals of said semiconductor device to the corresponding pads during the testing.

17. The semiconductor device testing apparatus according to claim 16 wherein
each of said fine conductive wire-embedded members is securedly fitted to each of said device receiving carrier so as to always close the open bottom thereof,
while each insulator connection board is interchangeably mounted to the test head in correspondence to kind of the semiconductor device to be tested,
whereby different kind of the semiconductor devices can be tested without changing the fine conductive wire-embedded members.

18. The semiconductor device testing apparatus according to claim 16 in which said fine conductive wire-embedded member is securedly fitted in a groove formed in the inner wall of the lower portion of said device receiving carrier.

19. The semiconductor device testing apparatus according to claim 16 in which said fine conductive wire-embedded member is secured to the bottom of said device receiving carrier by fastener means.

20. The semiconductor device testing apparatus according to claim 16 in which said fine conductive wire-embedded member is securedly bonded to the bottom of said device receiving carrier by suitable adhesive.

21. The semiconductor device testing apparatus according to claim 16 in which a spacing between mutually adjacent two of the fine conductive wires of said fine conductive wire-embedded member is chosen to be approximately 0.1 mm.

22. The semiconductor device testing apparatus according to claim 16 in which the insulator plate of said fine conductive wire-embedded member is a resilient rubber plate or sheet, and said fine conductive wires are fine metal wires.

23. The semiconductor device testing apparatus according to claim 16 in which said conductor pads formed on the surface of said board are gold pads.

24. The semiconductor device testing apparatus according to claim 16 in which said board has multi-layered wiring patterns formed therein, said conductor pads formed on the surface of the board being electrically connected with the corresponding wiring patterns.

25. The semiconductor device testing apparatus according to claim 16 in which said semiconductor device to be tested is housed in a package of the surface mount type having terminals protruding parallel to each other from Its two opposed sides, said conductor pads are formed on two rows spaced apart by a predetermined distance in the surface of said board, each row including a multiplicity of conductor pads, the pitch of the conductor pads in each row corresponding with that of the terminals of said semiconductor device to be tested, and each conductor pad being elongated in a direction perpendicular to the longitudinal direction of the row.

26. The semiconductor device testing apparatus according to claim 25 in which said package of the surface mount type is TSOP.

27. The semiconductor device testing apparatus according to claim 16 in which said semiconductor device to be tested is housed in a package of the surface mount type having terminals protruding parallel to each other from its four sides, said conductor pads being formed on the surface of said board at the positions opposing the respective terminals of the semiconductor device being tested.

28. The semiconductor device testing apparatus according to claim 27 in which said package of the surface mount type is QFP.

29. The semiconductor device testing apparatus according to claim 16 in which said semiconductor device to be tested is housed in a package of the ball grid array structure having small solder balls arrayed in the form of a grid on the bottom thereof, said conductor pads being formed on the surface of said board at the positions opposing the respective solder balls.

30. The semiconductor device testing apparatus according to claim 16 in which
the insulator connection board of the test head is a circuit board in which said connection lead wires are formed as wiring patterns adapted to be connected to the test head, and
said circuit board is replaceable in accordance with a change of the type or kind of semiconductor device to be tested.

31. The semiconductor device testing apparatus according to claim 16 in which
the number of the insulator connection boards is smaller than that of the device receiving carriers.

32. The semiconductor device testing apparatus according to claim 16 in which
each of the lead terminals and each of the pads are mutually connected through a plurality of the fine conductive wires of the fine conductive wire-embedded member interposed therebetween.

* * * * *